(12) United States Patent
Dhindsa et al.

(10) Patent No.: US 8,290,717 B2
(45) Date of Patent: Oct. 16, 2012

(54) METHODS AND APPARATUS FOR WAFER AREA PRESSURE CONTROL IN AN ADJUSTABLE GAP PLASMA CHAMBER

(75) Inventors: Rajinder Dhindsa, San Jose, CA (US); James H. Rogers, Los Gatos, CA (US)

(73) Assignee: Lam Research Corporation, Fremont, CA (US)

( * ) Notice: Subject to any disclaimer, the term of this patent is extended or adjusted under 35 U.S.C. 154(b) by 454 days.

(21) Appl. No.: 12/367,443

(22) Filed: Feb. 6, 2009

(65) Prior Publication Data

US 2009/0204342 A1    Aug. 13, 2009

Related U.S. Application Data

(60) Provisional application No. 61/027,328, filed on Feb. 8, 2008.

(51) Int. Cl.
*G01N 31/00* (2006.01)
(52) U.S. Cl. ............ 702/22; 702/94; 702/150; 702/138; 702/140; 73/23.2; 73/1.79; 438/706; 438/714
(58) Field of Classification Search .................... 702/94, 702/150
See application file for complete search history.

(56) References Cited

U.S. PATENT DOCUMENTS

| | | | | |
|---|---|---|---|---|
| 5,132,545 A * | 7/1992 | Shono et al. | ............. | 250/492.2 |
| 5,354,413 A * | 10/1994 | Smesny et al. | ........... | 156/345.47 |
| 5,879,573 A * | 3/1999 | Robinett | ........................ | 216/59 |
| 6,019,060 A * | 2/2000 | Lenz | ......................... | 118/723 R |
| 6,022,483 A * | 2/2000 | Aral | ................................ | 216/59 |
| 6,221,202 B1 * | 4/2001 | Walko, II | ................. | 156/345.43 |
| 6,239,036 B1 * | 5/2001 | Arita et al. | ..................... | 438/714 |
| 6,350,317 B1 * | 2/2002 | Hao et al. | ........................ | 118/71 |
| 6,406,590 B1 | 6/2002 | Ebata et al. | | |
| 6,511,917 B2 * | 1/2003 | Haji et al. | ..................... | 438/706 |
| 6,652,710 B2 * | 11/2003 | Cruse | ...................... | 156/345.48 |
| 6,716,762 B1 | 4/2004 | Lenz | | |
| 6,823,815 B2 * | 11/2004 | Han et al. | .................. | 118/723 E |
| 6,824,627 B2 * | 11/2004 | Dhindsa et al. | ................. | 156/60 |

(Continued)

FOREIGN PATENT DOCUMENTS

JP          08-130207 A     5/1996

OTHER PUBLICATIONS

"International Preliminary Report on Patentability", issued in PCT Application No. PCT/US2009/033410; Mailing Date: Aug. 19, 2010.

(Continued)

*Primary Examiner* — Cindy H Khuu
*Assistant Examiner* — Timothy H Hwang
(74) *Attorney, Agent, or Firm* — Martine Penilla Group, LLP.

(57) ABSTRACT

In a plasma processing chamber, a method and an arrangement to stabilize pressure are provided. The method includes providing coarse pressure adjustments in an open-loop manner and thereafter providing fine pressure adjustments in a closed-loop manner. The coarse pressure adjustments are performed by rapidly re-position confinement rings employing an assumed linear relationship between the conductance and the confinement rings position to bring the pressure in the plasma generating region quickly to roughly a desired set point. The fine pressure adjustments are performed by at least employing mechanical vacuum pump(s), turbo pump(s), confinement ring positioning and/or combinations thereof to achieve a derive pressure set point.

18 Claims, 4 Drawing Sheets

U.S. PATENT DOCUMENTS

| | | | | |
|---|---|---|---|---|
| 6,872,281 B1* | 3/2005 | Chen et al. | | 156/345.43 |
| 6,962,664 B2* | 11/2005 | Mitrovic | | 216/59 |
| 7,364,623 B2* | 4/2008 | Cirigliano | | 118/715 |
| 2005/0176258 A1 | 8/2005 | Hirose et al. | | |
| 2005/0263070 A1* | 12/2005 | Fink | | 118/715 |
| 2006/0162657 A1* | 7/2006 | Cirigliano | | 118/715 |
| 2007/0023145 A1* | 2/2007 | Bera et al. | | 156/345.43 |
| 2009/0173389 A1* | 7/2009 | Fischer | | 137/2 |

OTHER PUBLICATIONS

"International Search Report", Issued in PCT Application No. PCT/US2009/033410; Mailing Date: Sep. 17, 2009.

"Written Opinion", Issued in PCT Application No. PCT/US2009/033410; Mailing Date: Sep. 17, 2009.

* cited by examiner

METHODS AND APPARATUS FOR WAFER AREA PRESSURE CONTROL IN AN ADJUSTABLE GAP PLASMA CHAMBER

PRIORITY CLAIM

This application is related to and claims priority under 35 U.S.C. 119(e) to a commonly assigned provisional patent application entitled "METHODS AND APPARATUS FOR WAFER AREA PRESSURE CONTROL IN AN ADJUSTABLE GAP PLASMA CHAMBER", by Dhindsa et al., Application Ser. No. 61/027,328 filed on Feb. 8, 2008, all of which are incorporated herein by reference.

BACKGROUND OF THE INVENTION

Advances in plasma processing have facilitated growth in the semiconductor industry. The semiconductor industry is a highly competitive market. The ability for a manufacturing company to be able to process substrates in different processing conditions may give the manufacturing company an edge over competitors. Thus, manufacturing companies have dedicated time and resources to identify methods and/or arrangements for improving substrate processing.

A typical processing system that may be employed to perform substrate processing may be a capacitively-coupled plasma (CCP) processing system. The plasma processing system may be built to enable processing in a range of process parameters. However, in recent years, the types of devices that may be processed have become more sophisticated and may require more precise process control. For example, devices being processed are becoming smaller with finer features and may require more precise control of plasma parameters, such as plasma density and uniformity across the substrate, for better yield. Pressure control of the wafer area in the etching chamber may be an example of a process parameter affecting plasma density and uniformity.

The manufacturing of semiconductor devices may require multi-step processes employing plasma within a plasma processing chamber. During plasma processing of semiconductor device(s) the plasma processing chamber may typically be maintained at a predefined pressure for each step of the process. The predefined pressure may be achieved through employing mechanical vacuum pump(s), turbo pump(s), confinement ring positioning and/or combinations thereof, as is well known by those skilled in the art.

Conventionally, a valve assembly may be employed to throttle the exhaust turbo pump(s) to attain pressure control for maintaining predefined pressure conditions in the plasma processing chamber. Alternatively or additionally, the pressure in the plasma generating region of the plasma processing chamber (e.g., the region encapsulated by the two electrodes and surrounded by the confinement rings) may be controlled by adjusting the gaps between the confinement rings of a confinement ring assembly. Adjusting the gaps controls the flow rate of exhaust gas from the plasma generating region and pressure may be affected as a result. The overall gas flow conductance out of the plasma generating region may depend on several factors, including but not limited to the number of confinement rings and the size of the gaps between the confinement rings.

In view of the need to process the substrate in multiple steps, each of which may involve a different pressure, improvement to the capability to efficiently control pressure in plasma processing systems is highly desirable.

SUMMARY OF INVENTION

The invention relates, in an embodiment, to a method to stabilize pressure in a plasma processing chamber. The method includes providing an upper electrode and a lower electrode for processing a substrate, where the upper electrode and said lower electrode form a chamber gap, and providing a first mechanism configured to mechanically couple to one of the upper electrode and the lower electrode. The method further includes providing a set of confinement rings and providing a second mechanism configured to mechanically couple to the set of confinement rings. The method yet further includes determining a plurality of conductance curves for different height values of the chamber gap, correlating confinement ring position (CRP) offset values of the set of confinement rings with the different height values of the chamber gap, specifying a first height value for the chamber gap adjusting the chamber gap to the first height value by moving the first mechanism, determining a first CRP offset value from a current CRP using the correlating, and adjusting the set of confinement rings to a new CRP in an open-loop manner using the first CRP offset value by moving the second mechanism.

The above summary relates to only one of the many embodiments of the invention disclosed herein and is not intended to limit the scope of the invention, which is set forth is the claims herein. These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF EMBODIMENTS

The present invention will now be described in detail with reference to a few embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

In accordance with embodiments of the invention, there are provided methods and apparatus for configuring plasma processing systems to achieve rapid control over plasma processing parameters. In some plasma processing systems, the chamber gap (i.e., the gap between the upper and lower electrode) is a recipe parameter and may vary from step to step. In these plasma processing systems, there may be provided a mechanism configured to move the lower electrode assembly to adjust the chamber gap. In other plasma processing systems, the upper electrode assembly may be moved. In the disclosure herein, the chamber is assumed to have a moving lower electrode. It should be understood, however, that embodiments of the invention herein apply equally well to chambers in which the upper electrode is movable (alternatively or additionally).

When the chamber gap is moved in response to recipe requirements, the volume of the plasma generating region is changed. This change in volume affects the pressure within the plasma generating region, requiring compensation to adjust for the pressure change. In the prior art, as mentioned, pressure control is achieved by controlling the throttle valve position upstream of the exhaust turbo pump and/or by controlling the position of the confinement rings to change the gaps between the confinement rings, thereby changing the conductance of the gas exhausting from the plasma generating region.

Figure 1:
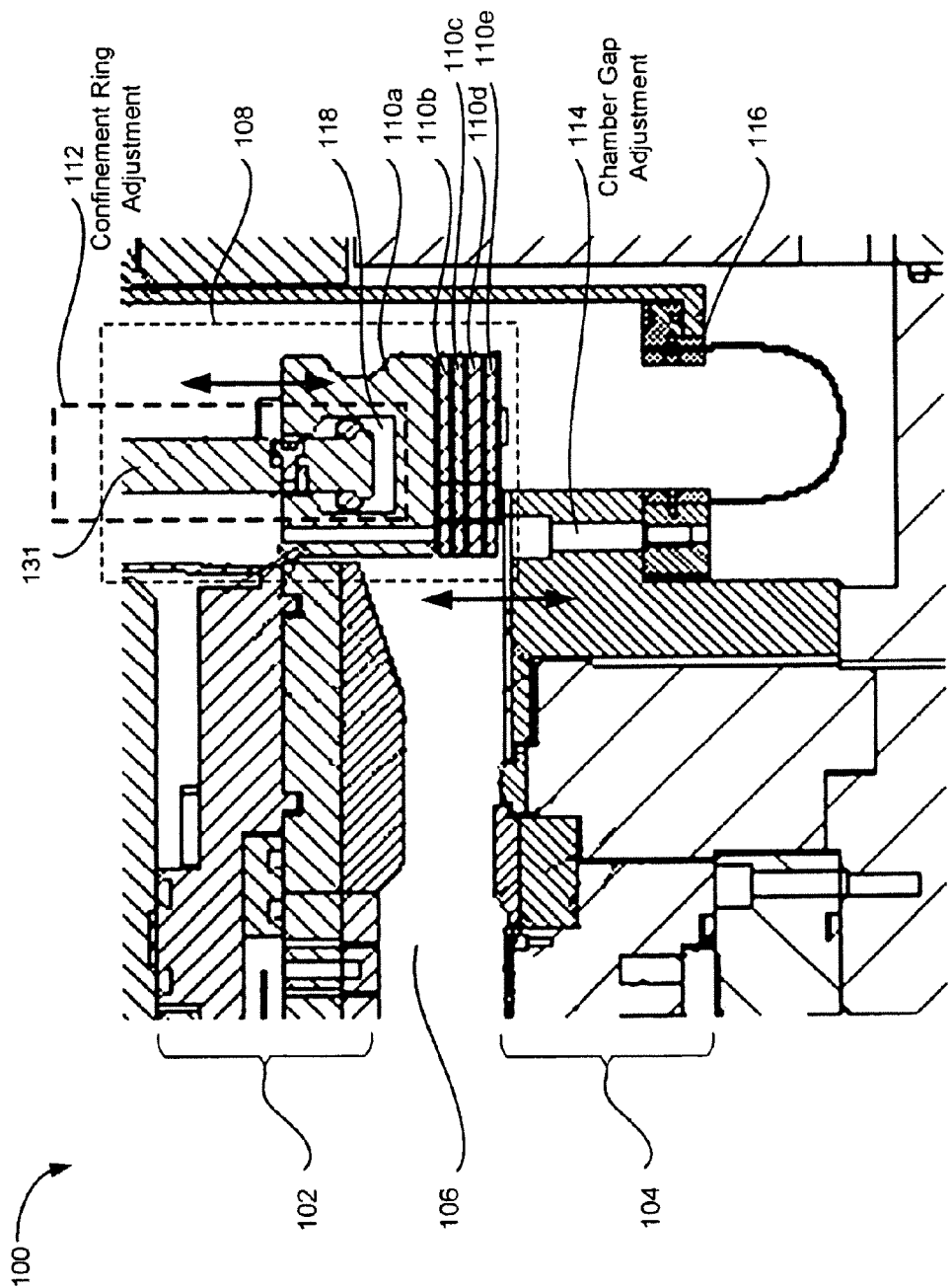
FIG. 1 shows, in accordance with an embodiment of the present invention, a simplified schematic of a plasma processing system configured to provide an adjustable gap between an upper electrode assembly and a lower electrode assembly.

Generally speaking, the confinement ring gaps may be adjusted by appropriately controlling the position of a plunger (see 131 of FIG. 1). In the upstroke of the plunger, the gaps between rings 110a, 110b, 110c, 110d, and 110e are expanded. In the down stroke of the plunger, rings 110a, 110b, 110c, 110d, and 110e collapse together in a sequential manner starting from the lower rings since the downward movement of ring 110e is arrested by the lower electrode, and the downward movement of ring 110d is arrested by ring 110e, and so on. Confinement ring assemblies are well-known in the art and will not be elaborated further herein.

When pressure control is desired in the prior art, a closed-loop control system is generally employed. In an example, the pressure within the plasma generating region is measured and/or derived and then compared against the desired pressure called for by the process recipe. If there is a discrepancy, plunger 131 is moved upward or downward appropriately to change the confinement ring gaps to control the conductance through the conductance ring gaps, thereby affecting the pressure within the plasma generating region. These measure-adjust-measure-adjust cycles are performed step-wise until the desired pressure set point is achieved.

While the prior art approach is satisfactory for chambers in which the electrodes are stationary, this approach proves less than satisfactory for chambers with moving lower electrode. In these chambers, the sudden change in the volume of the plasma generating region due to lower electrode re-positioning may result in a temporary loss of closed-loop pressure control as the closed-loop control algorithm struggles to re-attain control. Even if the closed-loop control algorithm can rapidly re-acquire control to begin the adjustment process, the large and sudden change in pressure caused by the sudden re-positioning of the lower electrode may cause the closed-loop control algorithm to take quite a long time to stabilize the pressure to the desired set point. During this long pressure re-stabilization period, substrate processing is effectively halted. If the pressure re-stabilization period is unduly long, productivity may suffer.

In an embodiment of the invention, there is provided a novel pressure control algorithm for rapidly compensating for the large and sudden change in the pressure in the plasma generating region that results from lower electrode (or upper electrode) repositioning. The inventor herein realizes that for a given pressure, the chamber gap (i.e., the distance between the upper and lower electrodes) relates to the confinement rings position (as determined by the position of the plunger) in roughly (though not exactly) a linear relationship. The inventor herein also realizes that for each chamber gap, the conductance (in liters/second) through the confinement rings relates to the confinement rings position (as determined by the position of the plunger) in roughly (though not exactly) a linear relationship.

Further, the inventor realizes that as the gap changes, the roughly linear relationship between the conductance and the confinement rings position is roughly-maintained. By plotting the conductance versus confinement rings position curves for various chamber gaps, each conductance curve may be shown to be substantially linear and furthermore, the conductance curves are substantially parallel.

From these relationships, the inventor realizes that a rough open-loop control strategy may be employed, using confinement ring re-positioning parameters furnished by these relationships, to rapidly re-position the confinement rings to bring the pressure in the plasma generating region quickly to roughly the desired set point. Once the rough re-positioning is made in an open-loop manner, the finer close-loop control strategy may be employed to quickly bring the pressure to the desired pressure set point. However, since the open-loop re-positioning is only a rough re-positioning and is not depended upon for precise pressure control, non-linearity in conductance versus confinement rings position for various chamber gaps may be safely ignored. This key realization vastly simplifies calculation and renders the rough open-loop repositioning process rapid.

In an embodiment, the inventor deduces that rough pressure compensation for chamber gap changes may be rapidly made by calculating the offset from one conductance curve to another and by moving the confinement rings position by that amount of calculated offset. Once the rough pressure compensation is performed, closed-loop control may take over to stabilize the pressure to the desired pressure set point. In this manner, pressure compensation is achieved in two phases: 1) an open-loop first phase wherein the confinement rings are moved rapidly using the calculated offset value from previously derived conductance data, and 2) a subsequent closed-loop phase to achieve the derive pressure set point.

The features and advantages of the present invention may be better understood with reference to the figures and discussions (with prior art mechanisms and embodiments of the invention contrasted) that follow.

FIG. 1 shows, in accordance with an embodiment of the present invention, a simplified schematic of a plasma processing system configured to provide an adjustable gap between an upper electrode assembly and a lower electrode assembly. Plasma processing system 100 may be a single, double or triple frequency capacitively discharged system or may be an inductively coupled plasma system or a plasma system employing a different plasma generating and/or sustaining technology. In the example of FIG. 1, radio frequency may include, but are not limited to, 2, 27 and 60 MHz.

In the example of FIG. 1, plasma processing system 100 may be configured with an upper electrode assembly 102 and a lower electrode assembly 104, in an embodiment. The upper electrode assembly 102 and lower electrode assembly 104 may be separated from each other by a chamber gap 106. The upper electrode assembly 102 may include an upper electrode that may be grounded or powered by an RF power supply (not shown).

During plasma processing, processed gas (not shown) may be supplied into chamber gap 106. The processed gas being supplied into chamber gap 106 may be excited into a plasma state by RF power supplied to lower electrode assembly 104. The plasma in chamber gap 106 may be confined by a confinement ring assembly 108 that may be configured with at least a set of confinement rings (110a, 110b, 110c, 110d, and 110e). The confinement ring assembly may also be configured with a gap control mechanism 112, including a plunger 131, for controlling the gaps between confinement rings (110a-e). Exhaust gases in chamber gap 106 (i.e., the plasma generating region) may pass through confinement-ring gaps between the set of confinement rings (110a-e). These exhaust gases may be exhausted from the chamber by a vacuum pump (not shown to simplify illustration) via a throttle valve.

In an embodiment, lower electrode assembly 104 may be configured with a piston 114 and an actuation mechanism 116 to allow lower electrode assembly 104 to be moved up or down. As a result, the volume within the plasma generating region may change, which results in a change in the pressure and thus requires compensation by confinement ring re-positioning.

Referring to FIG. 1, upon moving lower electrode assembly 104 to accommodate recipe requirements for a given step, confinement ring assembly 108 may move correspondingly with the motion of lower electrode assembly 104, thereby changing the gaps between confinement ring assembly 108. Accordingly, the pressure in the plasma generating region is altered not only by the sudden change in volume of the plasma generating region but also by the change in the confinement ring gaps.

In order to maintain the predetermined pressure (for example, the pressure that existed before lower electrode movement), the position of confinement ring assembly 108 may need to be adjusted to change the conductance (in liters/second) of the exhaust gas to compensate for the change in plasma generating region volume and/or the change in confinement ring gaps that result from lower electrode movement.

Figure 2:
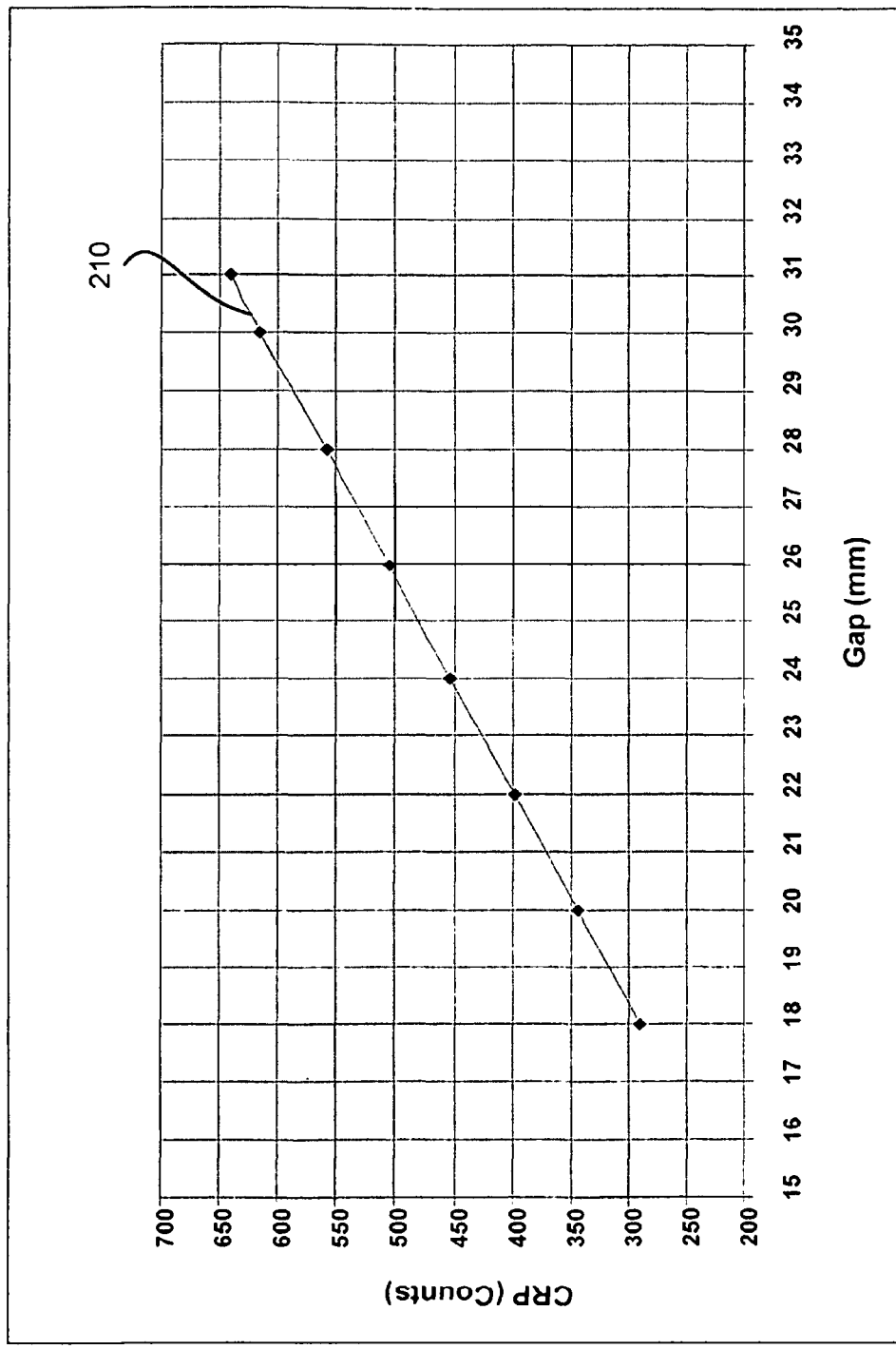
FIG. 2 shows, in accordance with an embodiment of the present invention, a plot of confinement ring position (CRP) as a function of chamber gap for a predefined pressure.

FIG. 2 shows, in accordance with an embodiment of the present invention, a plot of confinement ring position (CRP) as a function of chamber gap for a predefined pressure. FIG. 2 is discussed in relation to FIG. 1 to facilitate understanding.

As shown in FIG. 2, the vertical axis is shown as the confinement ring position in arbitrary count unit. In an implementation, the arbitrary count unit may be the servo motor index of the servo motor employed to control the up/down movement of plunger 131. The horizontal axis shows the chamber gap in millimeter (mm). Plot line 210 shows a linear relationship between confinement ring position and chamber gap for a given pressure.

Figure 3:
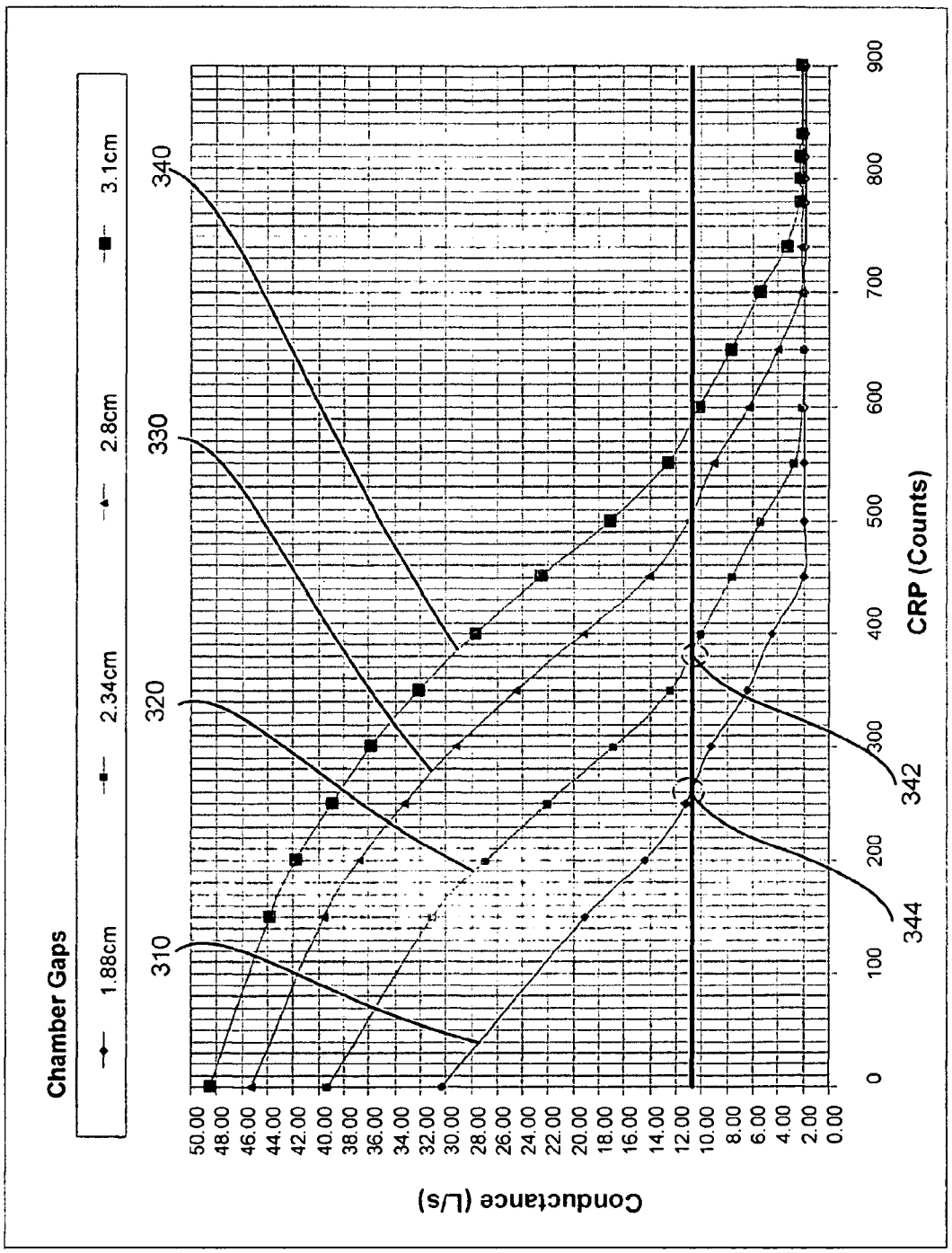
FIG. 3 shows, in accordance with an embodiment of the present invention, a plurality of empirically derived conductance curves (which illustrates conductance versus confinement ring position) for different chamber gaps.

FIG. 3 shows, in accordance with an embodiment of the present invention, a plurality of empirically derived conductance curves (which illustrates conductance versus confinement ring position) for different chamber gaps.

As shown in FIG. 3, the vertical axis is shown as conductance in liter per second (L/s). The horizontal axis is shown as the confinement ring position (CRP), again in arbitrary count unit. Plot line 310 is the conductance curve for a chamber gap value of 1.88 centimeter (cm). Plot line 320 is the conductance curve for a chamber gap value of 2.34 cm. Plot line 330 is the conductance curve for a chamber gap value of 2.8 cm. Plot line 340 is the conductance curve for a chamber gap value of 3.1 cm.

A few observations may be made from FIG. 3. First, the curves are substantially linear in the region of chamber operation, i.e., above 4 liters/sec. Second, these curves are substantially parallel, illustrating that the linear relationship between the conductance and the confinement ring position is substantially preserved when the gap is changed. Third, for any given desired conductance (such as 11 liters/second in FIG. 2), the change in conductances attributable to a change in the chamber gaps may be compensated for simply by moving the confinement ring by the amount of x-axis offset from one curve to another. With reference to FIG. 2, the change in conductance as the chamber gap is moved from 2.34 cm (curve 320) to 1.88 cm (curve 310) may be compensated for by moving the confinement ring position by an amount that is equal to the offset (between point 344 and point 342). Moving the confinement ring position by the offset (difference between point 342 and point 344) has the effect of roughly moving conductance curve 310 to superimpose on conductance curve 320. In so doing, the conductance change due to gap change is compensated for and rough conductance compensation is achieved in an open-loop manner.

In an embodiment, the current chamber gap position may be represented by "X". The change in chamber gap may be +/−"Y" The current CRP may be represented by "A". The new chamber gap and new CRP may be calculated as followed:

New chamber gap position=$X+/-Y$ (Equation 1).

New CRP=$A+/-(M*Y)$ (Equation 2), where M is the slope determined from the conductance curves of FIG. 3.

As may be appreciated from the foregoing, the plurality of conductance curves for each chamber gap may be empirically determined in an embodiment. Over the working conductance range, the plurality of conductance curves may be relatively linear, yielding a slope of about M in an embodiment. The offset CRP values may be determined for predetermined wafer area pressure(s) to compensate for the chamber gap adjustment(s). Alternatively, a simple lookup table may be employed to correlate chamber gaps with offsets. To facilitate the open-loop rough adjustment, the corresponding offset for a particular chamber gap may be obtained and/or estimated from the values provided by the lookup table.

Figure 4:
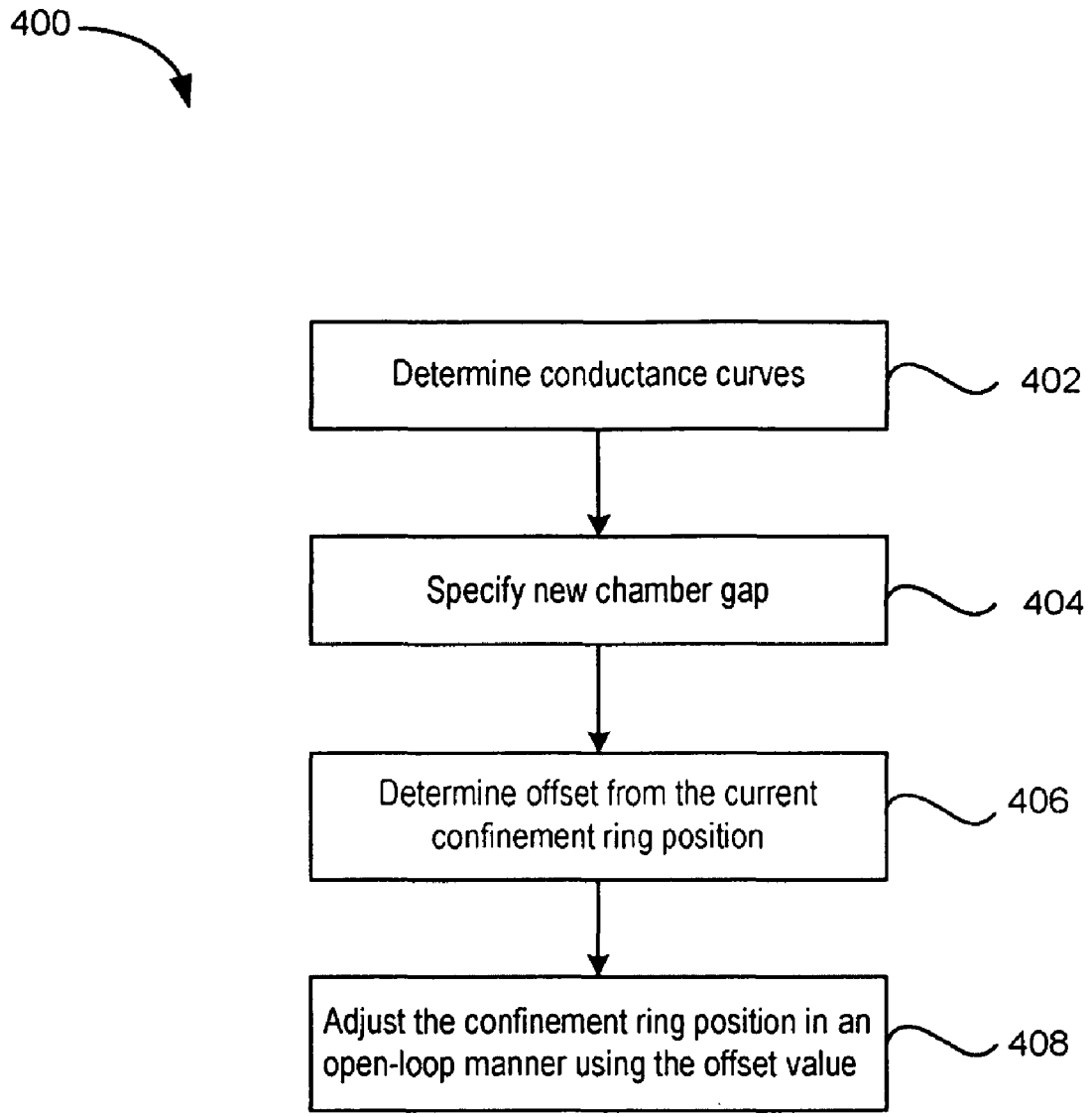
FIG. 4 shows, in accordance with an embodiment of the invention, a simplified flowchart of a method 400 for wafer area pressure control with adjustable chamber gap in real time.

FIG. 4 shows, in accordance with an embodiment of the invention, a simplified flowchart of a method 400 for wafer area pressure control with adjustable chamber gap in real time.

In step 402, a plurality of conductance curves for different chamber gaps may be empirically determined in an embodiment. In step 404, a new chamber gap is specified as part of a process recipe. In step 406, the offset from the current confinement ring position may be determined. This offset has been discussed earlier in connection with FIG. 3. To simplify the calculation and/or lookup, an arbitrarily chosen reference chamber gap may be employed to provide a reference to which all other chamber gaps may be referenced to, in an embodiment.

Once the offset is acquired, the confinement ring position may be adjusted in an open-loop manner using the offset value to rapidly (but roughly) re-position the confinement rings (step 408). This rapid repositioning roughly compensates for the change in the plasma generating region volume and the change in the confinement ring gaps caused by the movement of the lower electrode. Once the rough repositioning is accomplished, fine (but slower) close-loop control, in the manner done in the prior art, may be employed to more precisely establish the pressure in the plasma generating region at a desired set point pressure. Once the pressure is re-stabilized, other changes in the pressure (such as to accommodate pressure change in a different step) may be accomplished using techniques known in the prior art.

As can be appreciated from the foregoing, embodiments of the invention permit pressure compensation to be performed in a rapid manner by rapidly repositioning the confinement rings in a two-step process. In the first step, the confinement rings are rapidly repositioned in an open-loop manner using an offset value obtained from previously acquired conductance data (which correlate conductance with confinement ring positions for various chamber gaps). In the second step, traditional closed-loop control may be employed to more precisely stabilize the pressure at the desired value. By rapidly compensating for the change in pressure that is caused by the moving electrode(s), the pressure stabilization step may be shortened, leading to improved productivity. Furthermore, embodiments of the invention may improve and or make possible the ability to sustain ignition of the plasma as the processing proceeds from step to step, each of which may call for a different chamber gap and a different pressure setting.

While this invention has been described in terms of several preferred embodiments, there are alterations, permutations, and equivalents, which fall within the scope of this invention. Although various examples are provided herein, it is intended that these examples be illustrative and not limiting with respect to the invention.

Also, the title and summary are provided herein for convenience and should not be used to construe the scope of the claims herein. Further, the abstract is written in a highly abbreviated form and is provided herein for convenience and thus should not be employed to construe or limit the overall invention, which is expressed in the claims. If the term "set" is employed herein, such term is intended to have its commonly understood mathematical meaning to cover zero, one, or more than one member. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A method to stabilize pressure in a plasma processing chamber, said method comprising:
    providing an upper electrode and a lower electrode for processing a substrate in said plasma processing chamber, said upper electrode and said lower electrode form a chamber gap;
    providing a first mechanism configured to mechanically couple to one of said upper electrode or said lower electrode;
    providing a set of confinement rings;
    providing a second mechanism configured to mechanically couple to said set of confinement rings;
    determining a plurality of conductance curves for different height values of said chamber gap;
    correlating confinement ring position (CRP) values of said set of confinement rings with said different height values of said chamber gap based on the plurality of conductance curves;
    specifying a first height value for said chamber gap;
    adjusting said chamber gap to said first height value by moving said first mechanism;
    determining a new CRP value from a current CRP value using said correlating;
    adjusting said set of confinement rings to said new CRP value in an open-loop manner by moving said second mechanism; and providing fine pressure adjustments in a closed-loop manner for said plasma processing chamber after adjusting said set of confinement rings.

2. The method of claim 1, wherein said plurality of conductance curves are determined empirically.

3. The method of claim 1, wherein said plurality of conductance curves are substantially linear about a working conductance value for purpose of said correlating.

4. The method of claim 1, wherein said correlating is performed for a predetermined substrate area pressure.

5. The method of claim 1 further comprising selecting a reference value for said chamber gap.

6. The method of claim 1, wherein said upper electrode is movable.

7. The method of claim 1, wherein said lower electrode is moveable.

8. The method of claim 1, wherein said fine pressure adjustment is performed by controlling an exhaust rate of a turbo pump.

9. The method of claim 1, wherein said fine pressure adjustment is performed by adjusting gaps between said confinement rings.

10. An article of manufacture comprising a non-transitory computer readable program storage medium having computer readable code embodied therein, said computer readable code when executed by a computer is being configured to stabilize pressure in a plasma processing chamber having an upper electrode, a lower electrode, and a set of confinement rings for processing a substrate, said article comprising:
    computer readable code for providing a plurality of conductance curves for different height values of a chamber gap formed by said upper electrode and said lower electrode;
    computer readable code for correlating confinement ring position (CRP) values of said set of confinement rings with said different height values of said chamber gap based on the plurality of conductance curves;
    computer readable code for specifying a first height value for said chamber gap;
    computer readable code for adjusting said chamber gap to said first height value by moving a first mechanism mechanically coupled to one of said upper electrode or said lower electrode;
    computer readable code for determining a new CRP value from a current CRP offset value using said correlating;
    computer readable code for adjusting said set of confinement rings to said new CRP value in an open-loop manner by moving a second mechanism mechanically coupled to said set of confinement rings; and computer readable code for providing fine pressure adjustments in a closed-loop manner for said plasma processing chamber after adjusting said set of confinement rings.

11. The article of manufacture of claim 10, wherein said plurality of conductance curves are determined empirically.

12. The article of manufacture of claim 10, wherein said plurality of conductance curves are substantially linear about a working conductance value for purpose of said correlating.

13. The article of manufacture of claim 10, wherein said correlating is performed for a predetermined substrate area pressure.

14. The article of manufacture of claim 10 further comprising computer readable code for selecting a reference value for said chamber gap.

15. The article of manufacture of claim 10, wherein said upper electrode is movable.

16. The article of manufacture of claim 10, wherein said lower electrode is moveable.

17. The article of manufacture of claim 10, wherein said fine pressure adjustment is performed by controlling an exhaust rate of a turbo pump.

18. The article of manufacture of claim 10, wherein said fine pressure adjustment is performed by adjusting gaps between said confinement rings.

* * * * *